(12) United States Patent
Terao et al.

(10) Patent No.: US 12,119,962 B2
(45) Date of Patent: Oct. 15, 2024

(54) SAMPLING CIRCUIT (71) Applicant: Nippon Telegraph and Telephone Corporation, Tokyo (JP)

(72) Inventors: Naoki Terao, Tokyo (JP); Munehiko Nagatani, Tokyo (JP); Hideyuki Nosaka, Tokyo (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 178 days.

(21) Appl. No.: 17/630,375

(22) PCT Filed: Aug. 5, 2019

(86) PCT No.: PCT/JP2019/030672
§ 371 (c)(1),
(2) Date: Jan. 26, 2022

(87) PCT Pub. No.: WO2021/024343
PCT Pub. Date: Feb. 11, 2021

(65) Prior Publication Data
US 2022/0294671 A1  Sep. 15, 2022

(51) Int. Cl.
*H04L 25/02* (2006.01)
*G01R 27/32* (2006.01)
*G01R 31/28* (2006.01)
*G01R 31/58* (2020.01)
*G06F 3/05* (2006.01)
*H03M 1/12* (2006.01)

(52) U.S. Cl.
CPC .......... *H04L 25/0272* (2013.01); *G01R 27/32* (2013.01); *G01R 31/2813* (2013.01); *G01R 31/58* (2020.01); *G06F 3/05* (2013.01); *H03M 1/126* (2013.01)

(58) Field of Classification Search
CPC . H04L 25/0272; G01R 31/58; G01R 31/2813; G01R 27/32; G01R 3/05; H03M 1/126
USPC ....................................................... 375/262
See application file for complete search history.

(56) References Cited

U.S. PATENT DOCUMENTS

2019/0206450 A1* 7/2019 Contreras ............... H01L 24/02
2019/0272003 A1* 9/2019 Miyanishi ................ G06F 1/10

OTHER PUBLICATIONS

Black et al., "Time interleaved converter arrays", IEEE Journal of Solid-State Circuits, vol. SC-15, No. 6, Dec. 1980, pp. 1022-1029.

* cited by examiner

*Primary Examiner* — Kevin M Burd
(74) *Attorney, Agent, or Firm* — Slater Matsil, LLP (57) ABSTRACT

A sampling circuit includes: a first transmission line that transmits an input signal; a second transmission line that transmits a clock signal; and a plurality of sample-hold circuits that are connected to the first and second transmission lines at a constant line distance, wherein the first transmission line transmits the input signal at a first propagation time for each of the line distances, and the second transmission line transmits the clock signal at a second propagation time that is a sum of a preset sampling interval and the first propagation time for each of the line distances.

12 Claims, 8 Drawing Sheets

SAMPLING CIRCUIT

CROSS-REFERENCE TO RELATED APPLICATIONS

This application is a national phase entry of PCT Application No. PCT/JP2019/030672, filed on Aug. 5, 2019, which application is hereby incorporated herein by reference.

TECHNICAL FIELD

The present invention relates to a sampling circuit technology for sampling a high-frequency input signal using a time-interleaved configuration.

BACKGROUND

In recent years, data rates processed by communication systems have been speeded up year by year with the high speed and high capacity of wired communication or wireless communication. Accordingly, conversion speeds required in AD convertors that convert analog values to digital values have also been speeded up. Since input has to be held constant while an AD convertor converts an input value, a sampling circuit is used at the previous stage of the AD convertor. A sampling circuit is a circuit that acquires (samples) an input value sequential in a time direction at a clock cycle and holds the acquired input value for a certain period of time. Here, a sampling frequency per unit time is called a sampling rate.

In order to comply with the high speed of data rates required in communication in recent years, sampling circuits having faster sampling rates are indispensable. Since a moment at which an input value is held occurs once per clock cycle in a sampling circuit, a relationship in which a sampling rate is equal to a clock frequency is established as shown in the following formula.

(Sampling Rate)=(Clock Frequency)

An increase in a clock frequency improves resolution in a time direction but causes a problem that a required level in terms of an analog circuit design for a clock generation circuit, a clock buffer, or a sampling circuit itself is tightened.

Figure 8:
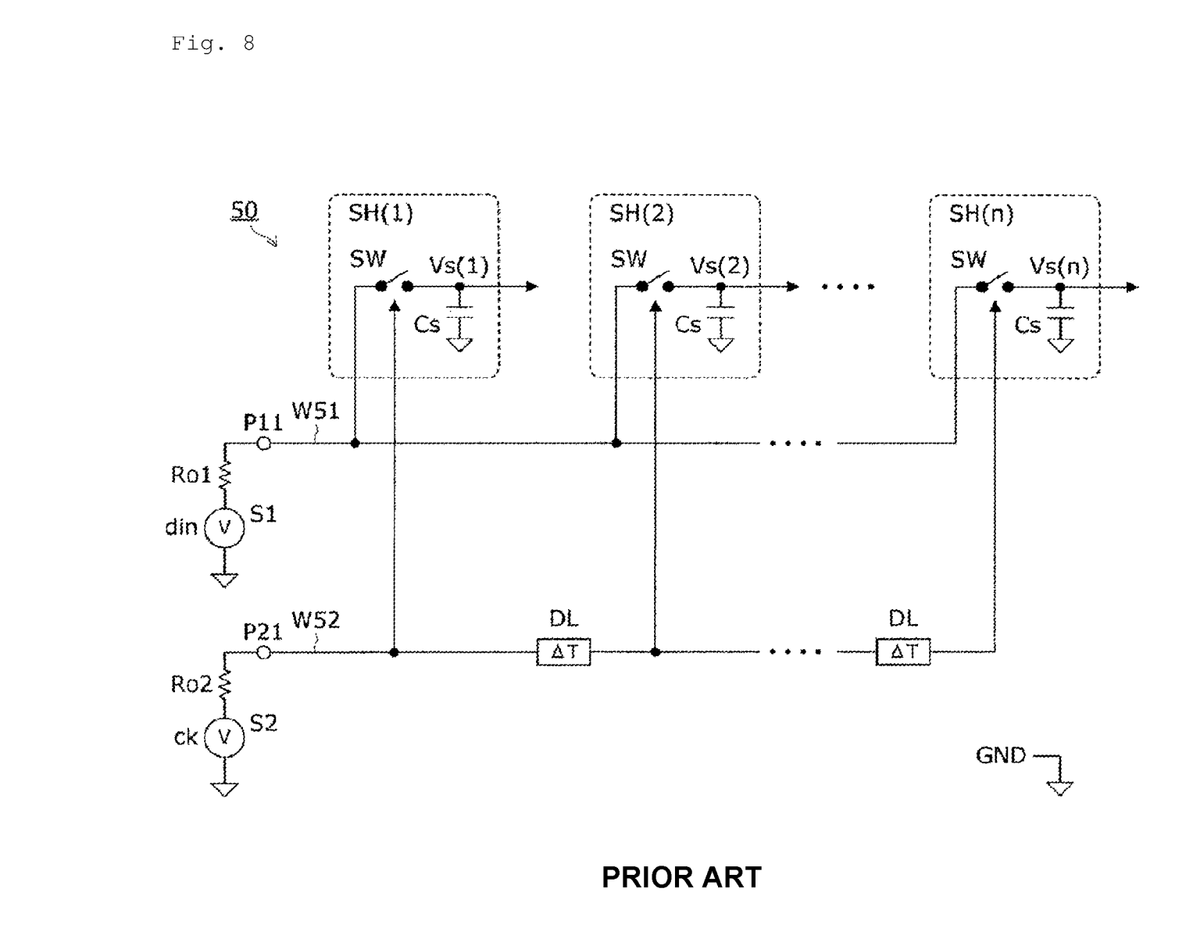
FIG. 8 is a circuit diagram showing a configuration example of a conventional sampling circuit.

Conventionally, a time-interleaved configuration has been proposed as a method in a circuit configuration for increasing a sampling rate without changing a clock frequency itself as described above (see, for example, Non-Patent Literature 1 or the like). FIG. 8 is a circuit diagram showing a configuration example of a conventional sampling circuit. In a conventional sampling circuit 50 shown in FIG. 8, a plurality of sample-hold circuits SH are used in parallel as a time-interleaved configuration. The number of the sample-hold circuits SH is called an interleave number and expressed as n (where n is an integer of 2 or more) here. Further, each of the n sample-hold circuits SH is expressed as a sample-hold circuit SH(i) (i=1, 2, . . . , n) in an order close to the input terminal of a transmission line.

Each of an input signal din and a clock signal ck is commonly supplied to the individual sample-hold circuits SH via a first transmission line W51 and a second transmission line W52. The clock signal ck is used to switch ON/OFF switches SW of the sample-hold circuits SH, that is, timing control for sampling. The input signal din is held by capacitive elements Cs of the sample-hold circuits SH at timing at which the switches SW are switched ON by the clock signal ck, and their holding voltages are output as sampling voltages Vs(i).

Here, the sampling circuit 50 is designed so that a time delay between the adjacent sample-hold circuits SH becomes $\Delta T=Tck/n$ where the time delay of the clock signal ck with respect to the whole interleave number n is one clock cycle of the clock signal ck, that is, Tck. In FIG. 8, $\Delta T$ in the middle of the second transmission line W52 expresses a time delay. In circuit-level mounting, the time delay is realized by, for example, a delay circuit DL of buffers or the like connected to each other in multiple stages.

It is assumed that a time at which the first sample-hold circuit SH(1) samples the input signal din is expressed as t=0 and a remainder obtained by dividing j by n with respect to an arbitrary integer value j=0, 1, 2, . . . is expressed as k. In this case, the sample-hold circuit SH (k+1) performs sampling at a time $t=\Delta T \times j$.

According, since any one of the sample-hold circuits SH(1) to S(n) necessarily performs sampling at the time $t=\Delta T \times j$, the sampling interval of the whole sampling circuit 50 becomes $\Delta T=Tck/n$. That is, the cycle of the input clock signal ck is Tck, and the whole circuit is allowed to perform sampling at a cycle $\Delta T$ shorter than Tck while the individual sample-hold circuits SH(i) operate at the cycle Tck.

When the above description is generalized, a relationship in which the sampling rate of the whole sampling circuit 50 is equal to the product of a clock frequency and an interleave number is established as shown in the following formula where a time-interleaved configuration is used.

(Sampling Rate)=(Clock Frequency)×(Interleave Number)

Accordingly, an increase in an interleave number makes it possible to perform sampling at a high rate even where a relatively low clock frequency is used such as when requirements in a clock generation circuit or a clock buffer are not severe.

CITATION LIST

Non Patent Literature

NPL 1—W. Black and D. Hodges, "Time interleaved converter arrays", ISSCC 1980.

SUMMARY

Technical Problem

In the sampling circuit 50 using the time-interleaved configuration described above, the input stages of the individual sample-hold circuits SH are actually composed of transistor elements, that is, input transistors. Accordingly, the input voltage of the input signal din is applied to base electrodes when the input transistors are bipolar transistors or applied to gate electrodes when the input transistors are MOSFETs. Hereinafter, an example in which bipolar transistors are used will be described, but similar discussion is applied without being limited by this example even when other transistors such as MOSFETs are used.

Generally, the base electrode of a bipolar transistor has an earth capacitance component as an input capacitance. This mainly results from a junction capacitance parasitic on a p-n junction between a base electrode and an emitter electrode and between a base electrode and a collector electrode. On the other hand, the individual sample-hold circuits SH are connected in parallel with each other when a time-interleaved configuration is used. Therefore, the input capacitance of the first transmission line W51 and the second transmission line W52 as a whole becomes the sum of the input capacitances of the individual sample-hold circuits SH. Accordingly, there is a problem that the whole input capacitance is increased with an increase in an interleave number and an input band is narrowed.

When it is assumed that an output resistance in relation to a signal source S1 of the input signal din is expressed as R01 on the first transmission line W51 and an interleave number is expressed as n, a cutoff frequency $f_{cutoff}$ with respect to the input signal din of the whole sampling circuit 50 is given by the following formula (1).

Math 1

$$f_{cutoff} = \frac{1}{2\pi R_{o1} n C_q} \quad (1)$$

The formula (i) shows that a denominator value is increased and the cutoff frequency $f_{cutoff}$ of the whole sampling circuit 50 is reduced with an increase in the interleave number n. Therefore, there is a problem that the cutoff frequency $f_{cutoff}$ reduced with an increase in the interleave number n and the input band of the sampling circuit 50 is consequently narrowed. Accordingly, if the signal frequency of the input signal din is reduced within a band inputtable to the sampling circuit 50, the data rate of the input signal din has to be inevitably reduced. Therefore, an original function and effect obtained by employing the time-interleaved configuration and increasing the sampling rate of the sampling circuit 50 is lost.

Embodiments of the present invention have been made in view of the problem and has an object of providing a sampling circuit technology capable of avoiding the narrowing of an input band associated with an increase in an interleave number and realizing a wide-band input characteristic.

Means for Solving the Problem

In order to achieve such an object, a sampling circuit according to embodiments of the present invention includes: a first transmission line that transmits an input signal input from one end to the other end; a second transmission line that transmits a clock signal input from one end to the other end; and a plurality of sample-hold circuits that are connected to the first and second transmission lines at a constant line distance, sample the input signal supplied from the first transmission line at timing designated by the clock signal supplied from the second transmission line, and hold and output the sampled input signal, wherein the first transmission line transmits the input signal at a first propagation time for each of the line distances, and the second transmission line transmits the clock signal at a second transmission time that is a sum of a preset sampling interval and the first propagation time for each of the line distances.

Effects of Embodiments of the Invention

According to embodiments of the present invention, it is possible avoid an increase in an input capacitance associated with an increase in an interleave number and maintain a wide-band input characteristic in speeding up a sampling circuit using time interleave.

DETAILED DESCRIPTION OF ILLUSTRATIVE EMBODIMENTS

Next, embodiments of the present invention will be described with reference to the drawings.

First Embodiment

Figure 1:
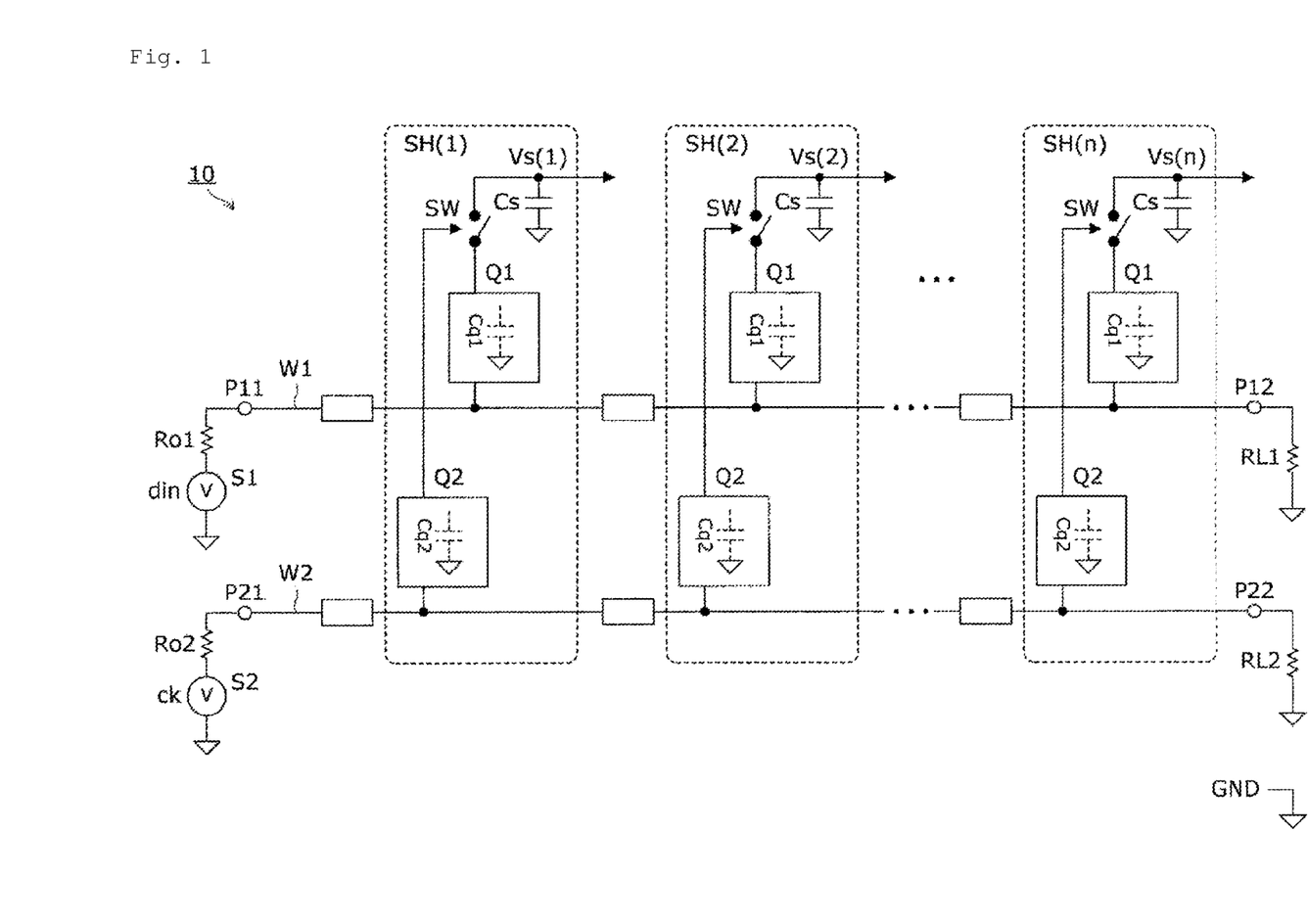
FIG. 1 is a circuit diagram showing the configuration of a sampling circuit according to a first embodiment.

First, a sampling circuit 10 according to a first embodiment of the present invention will be described with reference to FIG. 1. FIG. 1 is a circuit diagram showing the configuration of a sampling circuit according to the first embodiment.

As shown in FIG. 1, the sampling circuit 10 has n (where n is an integer of 2 or more) sample-hold circuits SH(i) (i=1, 2, . . . , n), a first transmission line W1, and a second transmission line W2. The n sample-hold circuits sample an input signal din input from an outside at designated timing and hold the sampled input signal din. The first transmission line W1 supplies the input signal din to the sample-hold circuits SH. The second transmission line W2 supplies a clock signal ck for designating sampling timing to the sample-hold circuits SH.

Sample-Hold Circuit

The sample-hold circuits SH are connected in parallel with each other at a constant line distance x with respect to the first transmission line W1 and the second transmission line W2. All the sample-hold circuits SH have the same circuit configuration and include a switch SW that is switched ON/OFF according to the clock signal ck and a capacitive element Cs that samples the input signal din input from the first transmission line W1 at timing at which the switch SW is switched ON, holds the sampled input signal din, and outputs its holding voltage as a sampling voltage Vs(i).

First Transmission Line

The first transmission line W1 is composed of a transmission line having a first line constant for causing the input signal din to propagate at a first propagation time Tx1 for each line distance x and configured to transmit the input signal din at the first propagation time Tx1 for each line distance x to supply the input signal din to each of the sample-hold circuits SH. A signal source S1 having an output resistance Ro1 from which the input signal din is supplied is connected between one end (input port) P11 of the first transmission line W1 and a ground potential GND. Further, a terminating resistance RL1 for impedance matching is connected between the other end (output port) P12 of the first transmission line W1 and the ground potential GND.

Second Transmission Line

The second transmission line W2 is composed of a transmission line having a second line constant for causing the clock signal ck to propagate at a second propagation time Tx2 for each line distance x and configured to transmit the clock signal ck at the second propagation time Tx2 that is the sum of a preset sampling interval ΔT and the first propagation time Tx1 for each line distance x to supply the clock signal ck to each of the sample-hold circuits SH. A signal source S2 having an output resistance R02 from which the clock signal ck is supplied is connected between one end (input port) P21 of the second transmission line W2 and the ground potential GND. Further, a terminating resistance RL2 for impedance matching is connected between the other end (output port) P22 of the second transmission line W2 and the ground potential GND.

Transmission Line

Next, a basic idea about a transmission line will be described.

Generally, a transmission line having a length of about several hundreds of μm or more is sometimes used for, for example, data transmission between different circuit blocks on the same chip inside an electronic circuit. However, when a high-frequency signal having a frequency of several tens to several hundreds of GHz is used, its wavelength reduces down to several hundreds of μm in propagation inside metal wiring surrounded by a dielectric. Accordingly, an ideal transmission line such as one handled in the lumped constant circuit of a low-frequency signal, that is, a transmission line in which a signal is transmitted at a zero time difference and no inductive component and no capacitive component exist cannot be assumed, and discussion considering characteristics as a signal wave has to be made.

When a high-frequency signal propagates through such a transmission line, the vectors of a voltage and a current, that is, the vectors of an electric field and a magnetic field surrounding the transmission line are different from each other depending on its propagating position even on the same transmission line. Accordingly, since an induced electromotive force due to a temporal change in a magnetic flux interlinking with looped wiring cannot be ignored in the case of a high-frequency signal, it can be interpreted that an inductive component is distributed to the whole transmission line.

Since a capacity for a ground potential GND cannot be ignored in the case of a high-frequency signal, it can be interpreted that a capacitive component is distributed to the whole transmission line. An inductive component and a capacitive component in the whole transmission line are in a trade-off relationship. This is because the capacitive component is increased with the proximity of wiring when an area surrounded by looped wiring is reduced to minimize the inductive component.

Figure 2:
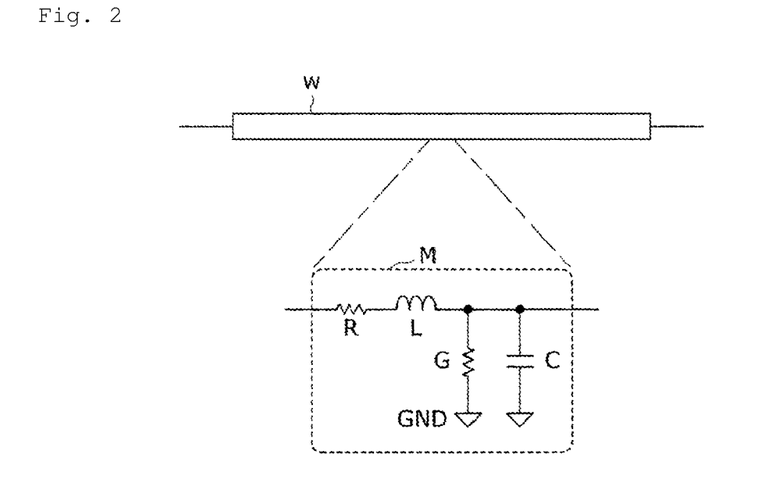
FIG. 2 is an explanatory diagram showing the distributed constant circuit of a transmission line.

FIG. 2 is an explanatory diagram showing the distributed constant circuit of a transmission line. When a power loss at each position of a transmission line is considered, the transmission line is expressed by a model using a distributed constant circuit as shown in FIG. 2. That is, it can be considered that a transmission line W is one in which modeled circuits, that is, distributed constant circuits M are infinitely connected to each other.

As shown in FIG. 2, a distributed constant circuit M per unit length in relation to the transmission line W is expressed by a resistance component R and an inductive component L generated in series in the transmission line W and a conductance component G and a capacitive component C generated between the transmission line W and a ground potential GND.

Accordingly, an electric signal propagating through the transmission line W is obtained as the solution of a telegraph equation established on the basis of such a model. According to this idea, actual behavior in a high frequency can be correctly described. The transmission line W is designed on the basis of the idea.

In order to facilitate understanding, it is assumed that $R \ll j\omega L$ and $G \ll j\omega C$ are established about the resistance component R that has a substantially large frequency ω and is generated in series in the transmission line W and the conductance component G generated between the transmission line W and the ground potential GND. At this time, the ratio of a voltage to a current propagating through the transmission line W is called characteristic impedance Z0. The characteristic impedance Z0 and a phase speed v showing a speed at which a waveform propagates are given by the following formula (2).

Math 2

$$Z_0 = \sqrt{\frac{L}{C}} \qquad (2)$$

$$v = \frac{1}{\sqrt{LC}}$$

When such a transmission line W is designed in an electronic circuit, a design method that does not produce a loss to a greater extent, has a uniform propagation characteristic over the whole transmission line W, and makes it easy to control the propagation characteristic is used. Specifically, a microstrip line, a strip line, a coplanar line, and the like are main physical design methods. The basic idea about a transmission line is described above.

First and Second Transmission Lines

Next, the first transmission line W1 and the second transmission line W2 of the sampling circuit 10 according to the present embodiment will be described with reference to FIG. 1. Hereinafter, a description will be given assuming a transmission line W representing the first transmission line W1 and the second transmission line W2.

In relation to the transmission line W (W1, W2) ignoring the sample-hold circuits SH, an inductive component and a capacitive component per unit length are expressed as L and C, respectively. When it is assumed that the sample-hold circuits SH are connected to the transmission line W at a constant line distance x, the input capacitances of the sample-hold circuits SH are connected to the transmission line W at the equal line distance x in the middle of the transmission line W. When it is assumed that the input stages of the sample-hold circuits SH are composed of transistor elements as described above, the input loads of the sample-hold circuits SH when seen from the side of the transmission line W have a capacitive component. The capacitive component is expressed as Cq (Cq1 and Cq2).

Here, when the capacitive components Cq are arranged at even intervals in the middle of the transmission line W, it can be considered that the inductive component per unit length remains at L and the capacitive component per unit length is increased to C+Cq/x when the transmission line W is seen from a wide perspective. A case in which the assumption is not established will be described later. Accordingly, since Cq is added to the original transmission line W, a pseudo transmission line having characteristics different from original characteristics has to be newly considered.

In embodiments of the present invention, such a new transmission line considering the input capacitances Cq of the sample-hold circuits SH is called a pseudo transmission line, and each of the first and second transmission lines W1 and W2 seems to be constituted by the pseudo transmission line. Further, in embodiments of the present invention, an inductive component L1 and a capacitive component C1 per unit length in relation to the first transmission line W1 are called first line constants, and an inductive component L2 and a capacitive component C2 per unit length in relation to the second transmission line W2 are called second line constants.

Note that since a phase speed v and a cutoff frequency $f_{cutoff}$ of a signal propagating through a pseudo transmission line directly affect the input characteristics of the sampling circuit 10, an inductive component L and a capacitive component C per unit length for calculating the phase speed v and the cutoff frequency $f_{cutoff}$ are called line constants in embodiments of the present invention and the case is not limited to this. However, the resistance component R and the conductance component G per unit length shown in FIG. 2 may be included in the line constants.

Accordingly, when it is assumed that the input capacitances Cq of the sample-hold circuits SH are connected for each line distance x, each of the characteristic impedance Z0 and the phase speed v of the pseudo transmission line is calculated by the following formula (3) using the above formula (2).

Math 3

$$Z_0 = \sqrt{\frac{L}{C + C_q/x}} \quad (3)$$

$$v = \frac{1}{\sqrt{L(C + C_q/x)}}$$

Operation of First Embodiment

Next, the operation of the sampling circuit 10 according to the present embodiment will be described with reference to FIG. 1.

The input signal din input to the one end P11 of the first transmission line W1 from the signal source S1 having the output resistance R01 propagates through the first transmission line W1 composed of a pseudo transmission line described above at a constant phase speed determined by the characteristics of the first transmission line W1 and reaches the terminating resistance RL1 connected to the other end P12 of the first transmission line W1. Since impedance matching is performed between the first transmission line W1 and the terminating resistance RL1 inclusive of input capacitances Cq1 of the individual sample-hold circuits SH on this occasion, the input signal din is absorbed into the terminating resistance RL1 as it is without being reflected by the other end P12.

When an inductive component and a capacitive component per unit length that are first line constants in relation to the first transmission line W1 are represented as L1 and C1, respectively, a first propagation time Tx1 required when the input signal din propagates between the sample-hold circuits SH adjacent to each other at a constant line distance x1 on the first transmission line W1 is expressed by the following formula (4).

Math 4

$$T_{x1} = x\sqrt{L_1(C_1 + C_{q1}/x)} \quad (4)$$

On the other hand, the clock signal ck input to the one end P21 of the second transmission line W2 from the signal source S2 having the output resistance Roe also propagates through the second transmission line W2 composed of a pseudo transmission line described above at a constant phase speed determined by the characteristics of the second transmission line W2 and reaches the terminating resistance RL2 connected to the other end P22 of the second transmission line W2 like the input signal din.

Since impedance matching is performed between the second transmission line W2 and the terminating resistance RL2 inclusive of input capacitances Cq2 of the individual sample-hold circuits SH on this occasion, the clock signal ck is absorbed into the terminating resistance RL2 as it is without being reflected by the other end P12.

When an inductive component and a capacitive component per unit length that are second line constants in relation to the second transmission line W2 are expressed as L2 and C2, respectively, and a sampling interval is expressed as ΔT and a clock cycle of the clock signal ck is expressed as Tck, a second propagation time Tx2 required when the clock signal ck propagates between the sample-hold circuits SH adjacent to each other at a constant line distance x2 on the second transmission line W2 is expressed by the following formula (5) using the first propagation time Tx1.

Math 5

$$T_{x2} = T_{x1} + \Delta T \quad (5)$$

$$\Delta T = \frac{T_{ck}}{n}$$

Accordingly, when the values of the inductive component L2 and the capacitive component C2 that are the second line constants are designed in accordance with the input capacitances Cq2 connected to the second transmission line W2 and the second propagation time Tx2 so that the second propagation time Tx2 becomes equal to the sum of the first propagation time Tx1 and the sampling interval ΔT, the input signal din and the clock signal ck input to the individual sample-hold circuits SH are synchronized with each other. Thus, in a state in which a clock frequency remains at Tck, sampling can be accurately performed at a cycle ΔT that is 1/n of that of the clock frequency.

Figure 3:
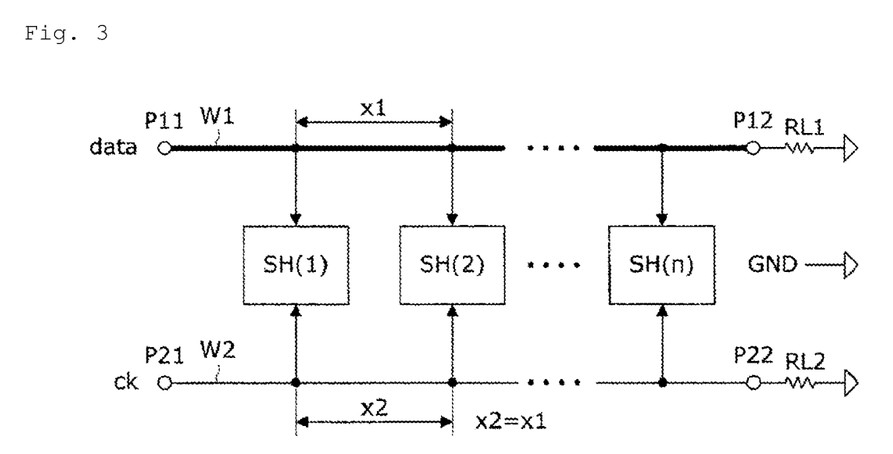
FIG. 3 is a block diagram showing a propagation time difference generation example (line width).
Figure 4:
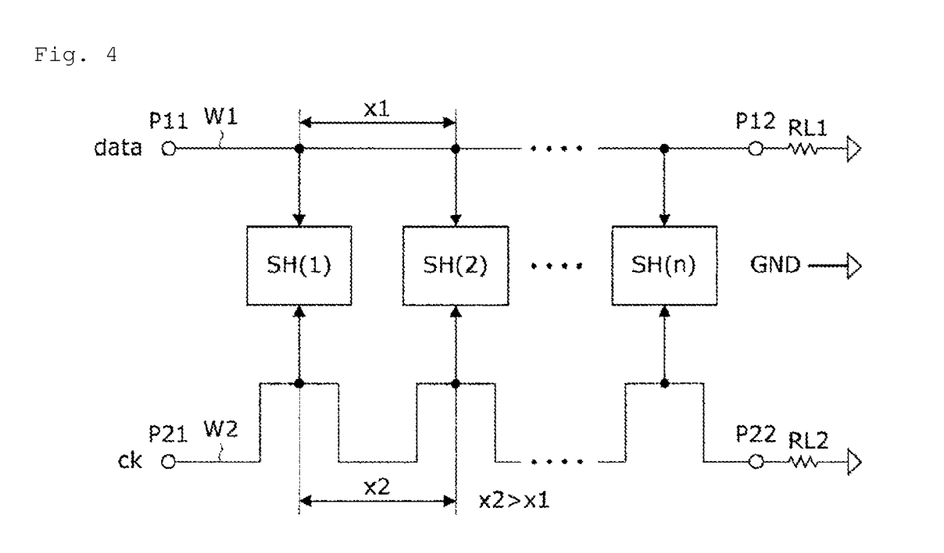
FIG. 4 is a block diagram showing a propagation time difference generation example (line length).
Figure 5:
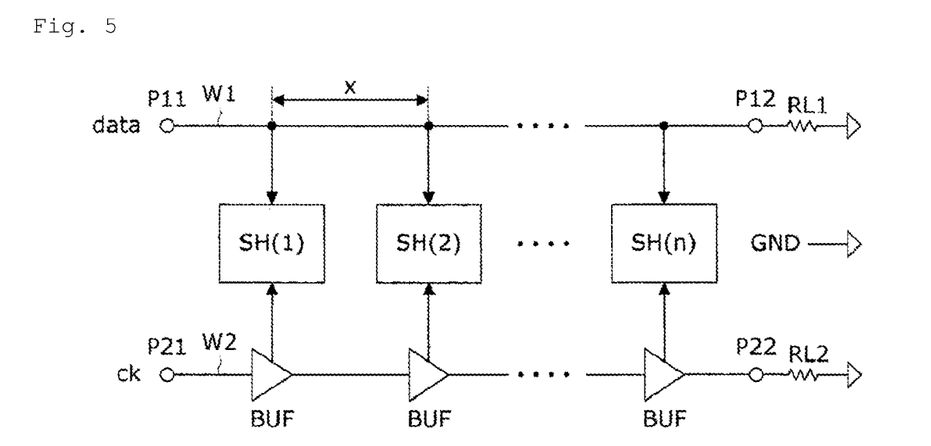
FIG. 5 is a block diagram showing a propagation time difference generation example (branch connection).

Hereinafter, a specific configuration example for generating a propagation time difference corresponding to the sampling interval ΔT in the first and second transmission lines W1 and W2 will be described with reference to FIGS. 3 to 5. FIG. 3 is a block diagram showing a propagation time difference generation example (line width). FIG. 4 is a block diagram showing a propagation time difference generation example (line length). FIG. 5 is a block diagram showing a propagation time difference generation example (branch connection).

The configuration example of FIG. 3 is a method in which any one or both of line widths and distances to the ground potential GND in relation to the first and second transmission lines W1 and W2 are adjusted to change line constants, that is, the capacitive components C1 and C2 and the inductive components L1 and L2 and determine respective phase speeds v to generate a propagation time difference. FIG. 3 shows the configuration example in which both of the first and second transmission lines W1 and W2 are formed into a linear shape, the line width of the first transmission line W1 is made larger than that of the second transmission line W2, and the line distances x1 and x2 at which the sample-hold circuits SH are connected to the first and second transmission lines W1 and W2 are made equal to each other (x1=x2).

According to the propagation time difference generation method of FIG. 3, the phase speed v of the second transmission line W2 is made smaller than that of the first transmission line W1 to generate a propagation time difference since the inductive component L2 is larger than the inductive component L1. As a result, the propagation of the clock signal ck is delayed compared with the input signal din. The configuration example of FIG. 3 is given as an example only and may be modified appropriately without being limited by this example. For example, any one or both of the first and second transmission lines W1 and W2 may be caused to meander in combination with the configuration example of FIG. 4 that will be described later.

The configuration example of FIG. 4 is a method in which the line widths of the first and second transmission lines W1 and W2 that connect the adjacent sample-hold circuits SH to each other are adjusted to change line constants, that is, the capacitive components C1 and C2 and the inductive components L1 and L2 and determine respective phase speeds v to generate a propagation time difference. FIG. 4 shows the configuration example in which the first transmission line W1 is formed into a linear shape and the second transmission line W2 is caused to meander in a zigzag shape (a rectangular shape, a meandering shape, or a sine wave shape) to make the line distance x2 of the second transmission line W2 longer than the line distance x1 of the first transmission line W1 (x1<x2).

According to the propagation time difference generation method of FIG. 4, the phase speed v of the second transmission line W2 is made smaller than that of the first transmission line W1 to generate a propagation time difference since the capacitive component C2 and the inductive component L2 are larger than the capacitive component C1 and the inductive component L1. As a result, the propagation of the clock signal ck is delayed compared with the input signal din. The configuration example of FIG. 3 is given as an example only and may be modified appropriately without being limited by this example. For example, both of the first and second transmission lines W1 and W2 may be caused to meander to make the meandering width of the second transmission line W2 larger than that of the first transmission line W1. Thus, the line distance x2 can be made longer than the line distance x1.

The configuration example of FIG. 5 is a method in which the second transmission line W2 is branched for each of the sample-hold circuits SH using a plurality of branch buffers BUF connected in series to each other to generate a propagation time difference in accordance with a delay time at the branch buffers BUF.

The configuration example of FIG. 5 is given as an example only and may be modified appropriately without being limited by this example. For example, the propagation time difference generation method of FIG. 5 may be arbitrarily combined with the propagation time difference generation methods of FIGS. 3 and 4 described above to be performed.

Note that the cases in which the first and second transmission lines W1 and W2 are composed of single end transmission lines are described above as examples but the cases are not limited to those. Any one or both of the first and second transmission lines W1 and W2 may be composed of differential transmission lines. The differential transmission lines are composed of two paired lines and transmit two signals having opposite phases on these two lines, that is, differential signals. Thus, in-phase noise can be cancelled, and even-order non-linear distortions can be suppressed.

Effect of First Embodiment

As described above, the present embodiment includes: the first transmission line W1 that transmits the input signal din input from the one end P11 to the other end P12; the second transmission line W2 that transmits the clock signal ck input from the one end P12 to the other end P22; and the plurality of sample-hold circuits SH connected to the first and second transmission lines W1 and W2 at the constant line distance x. Further, the first transmission line W1 transmits the input signal din at the first propagation time Tx1 for each line distance x, and the second transmission line W2 transmits the clock signal ck at the second propagation time Tx2 that is the sum of the preset sampling interval ΔT and the first propagation time Tx1 for each line distance x.

More specifically, the first transmission line W1 has the first line constants for causing the input signal din to propagate at the first propagation time Tx1 for each line distance x, that is, the inductive component L1 and the capacitive component C1 per unit length, and the second transmission line W2 has the second line constants for causing the clock signal ck to propagate at the second propagation time Tx2 for each line distance x, that is, the inductive component L2 and the capacitive component C2 per unit length.

Thus, the input capacitances Cq1 and Cq2 of the individual sample-hold circuits SH can be regarded as a part of the capacitive components C1 and C2 of the first and second transmission lines W1 and W2, respectively. That is, the input capacitances Cq1 and Cq2 are absorbed into the capacitive components C1 and C2, respectively. Therefore, it becomes possible to prevent an increase in the input capacitances Cq1 and Cq2 associated with an increase in an interleave number n in a conventional configuration described above and realize the widening of an input band in the sampling circuit 10.

Here, the cutoff frequency $f_{cutoff}$ of the transmission lines W (W1 and W2) in the present circuit configuration will be described. A transmission line in which a loss can be ignored does not theoretically have a cutoff frequency and can cause even an infinite high-frequency waveform to propagate therethrough. However, when the input capacitances Cq (Cq1 and Cq2) are arranged in terms of a lumped constant in the middle of the transmission line W like the present circuit configuration, the effect of a second-order low-pass filter constituted by L (L1 and L2) and C (C1 and C2) is produced with respect to the high-frequency signals (din and ck) to such an extent that the line distance x between the input capacitances Cq cannot be ignored with respect to a wavelength, and the waveform of a signal propagating through the transmission line W attenuates. The cutoff frequency $f_{cutoff}$ at this time is calculated by the following formula (6).

Math 6

$$f_{cutoff} = \frac{1}{2\pi\sqrt{xL(xC+C_q)}} \quad (6)$$

When a signal propagating through the transmission line W has a frequency substantially lower than the cutoff frequency $f_{cutoff}$, the input capacitances Cq are also regarded as the transmission line. However, if the signal has a high frequency as high as the cutoff frequency $f_{cutoff}$, the input capacitances Cq are regarded in terms of a lumped constant with respect to a waveform. Therefore, the characteristics of the second-order low-pass filter constituted by L and C appear, a signal propagating through the transmission line W attenuates, and the input band of the whole sampling circuit 10 becomes a band up to the cutoff frequency $f_{cutoff}$. On this occasion, an interleave number n is not included in a denominator in formula (6) unlike the cutoff frequency $f_{cutoff}$ of the conventional configuration described in the above formula (1). Accordingly, the cutoff frequency $f_{cutoff}$ does not reduce even if the interleave number n is increased.

Second Embodiment

Figure 6:
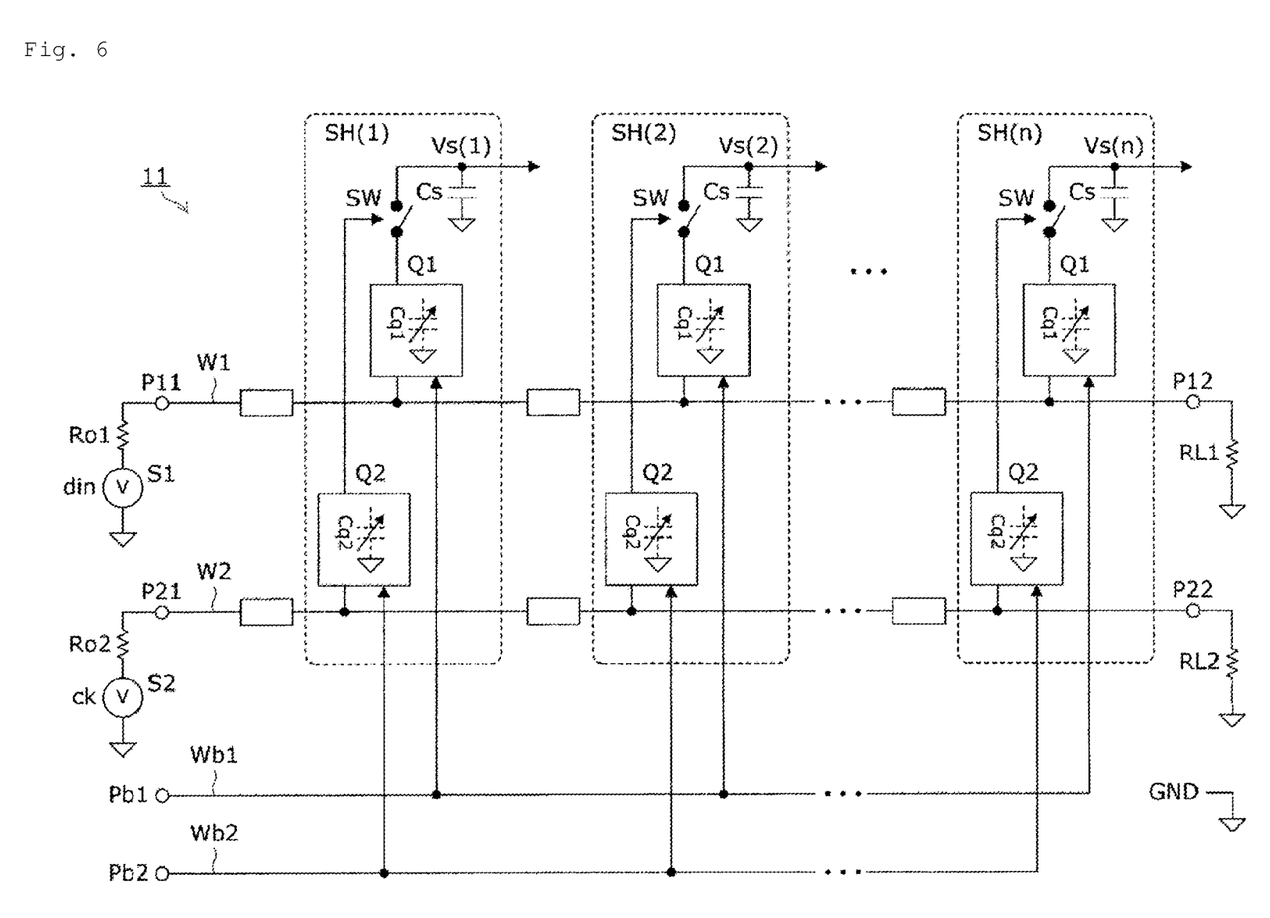
FIG. 6 is a circuit diagram showing the configuration of a sampling circuit according to a second embodiment.

Next, a sampling circuit 11 according to a second embodiment of the present invention will be described with reference to FIG. 6. FIG. 6 is a circuit diagram showing the configuration of a sampling circuit according to the second embodiment.

As described in the column of Technical Problem, an input capacitance Cq of a sample-hold circuit SH results from a junction capacitance parasitic on the p-n junction of an input transistor. When the input transistor is a bipolar transistor, the input capacitance Cq is composed of a junction capacitance parasitic on a p-n junction between a base electrode and an emitter electrode and between a base electrode and a collector electrode. The input capacitance Cq has dependence on bias voltages applied to both ends of a p-n junction. In the present embodiment, the bias voltages of an input signal din and a clock signal ck applied to an input transistor are adjusted to perform the variable control of the value of the input capacitance Cq.

In comparison with FIG. 1, first bias supply wiring Wb1 and second bias supply wiring Wb2 are added to the sampling circuit 11 according to the present embodiment as shown in FIG. 6.

The first bias supply wiring Wb1 is wiring that supplies a first bias voltage Vb1 to first input transistors Q1 to which the input signal din is input in the respective sample-hold circuits SH. The second bias supply wiring Wb2 is wiring that supplies a second bias voltage Vb2 to second input transistors Q2 to which the clock signal ck is input in the respective sample-hold circuits SH. FIG. 6 shows a case in which both of the first bias supply wiring Wb1 and the second bias supply wiring Wb2 are provided but the case is not limited to this. Only any one of the first bias supply wiring Wb1 and the second bias supply wiring Wb2 may be provided.

The first bias voltage Vb1 is input from one end (input port) Pb1 of the first bias supply wiring Wb1 and supplied to the first input transistors Q1 of the respective sample-hold circuits SH via the first bias supply wiring Wb1. Since the input capacitances Cq1 of the first input transistors Q1 reduce (increase) as the first bias voltage Vb1 becomes high (low), a first propagation time Tx1 in relation to the first transmission line W1 can be reduced (increased). Thus, the first propagation time Tx1 in relation to the first transmission line W1 can be controlled as a result of the adjustment of the voltage value of the first bias voltage Vb1.

Further, the second bias voltage Vb2 is input from one end (input port) Pb2 of the second bias supply wiring Wb2 and supplied to the second input transistors Q2 of the respective sample-hold circuits SH via the second bias supply wiring Wb2. Since the input capacitances Cq2 of the second input transistors Q2 reduce (increase) as the second bias voltage Vb2 becomes high (low), a second propagation time Tx2 in relation to the second transmission line W2 can be reduced (increased). Thus, the second propagation time Tx2 in relation to the second transmission line W2 can be controlled as a result of the adjustment of the voltage value of the second bias voltage Vb2.

Effect of Second Embodiment

As described above, the first propagation time Tx1 in relation to the first bias supply wiring Wb1 and the second propagation time Tx2 in relation to the second bias supply wiring Wb2 can be controlled according to the present embodiment. Generally, in order to change the sampling rate of time interleave, a delay amount ΔT=Tck/n has to be changed simultaneously when the clock frequency of a clock signal ck is changed. Since the first propagation time Tx1 and the second propagation time Tx2 can be controlled according to the present embodiment, a delay amount ΔT can also be changed easily. Accordingly, the sampling circuit 11 that makes it possible to easily change the sampling rate of time interleave can be realized.

Third Embodiment

Figure 7:
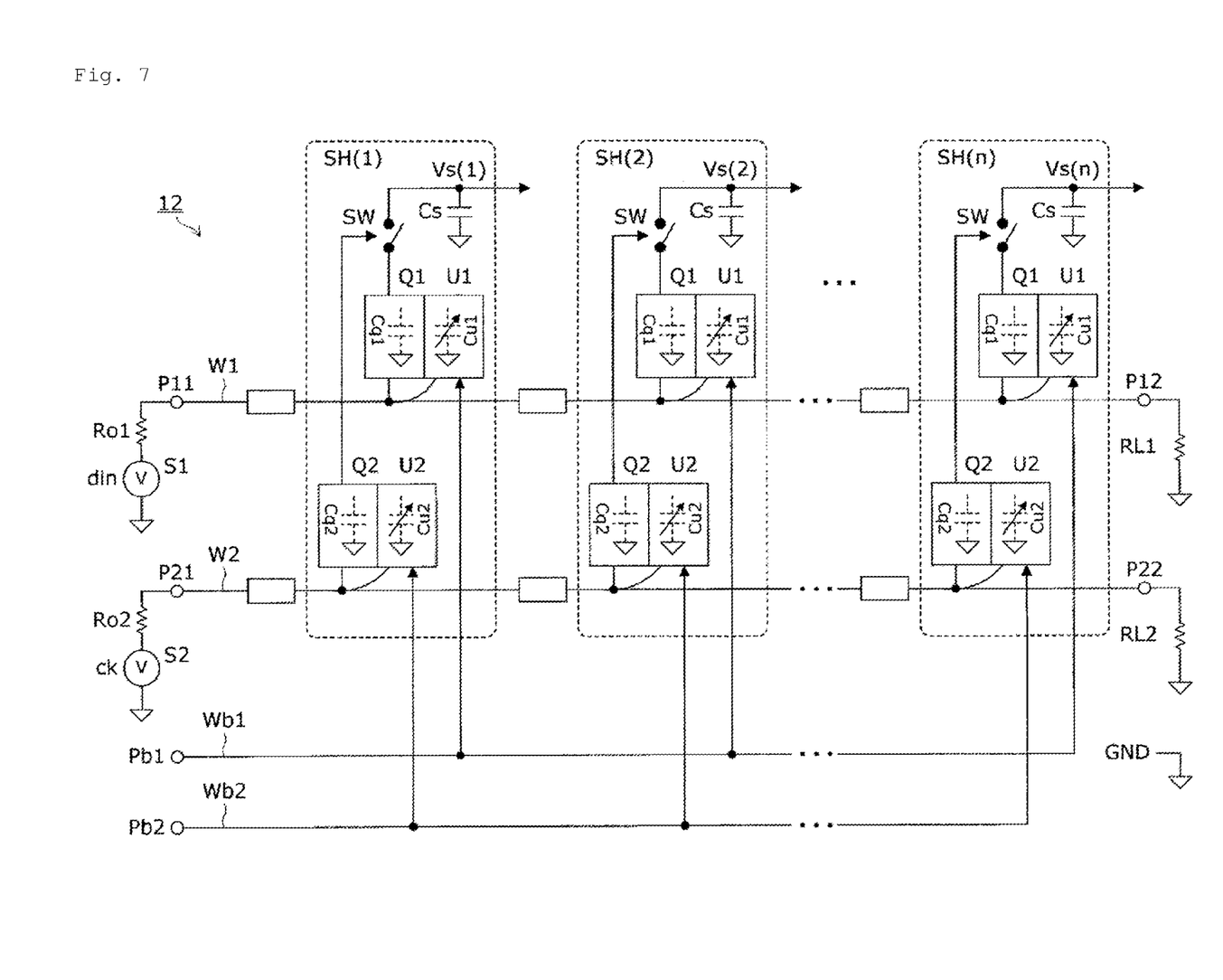
FIG. 7 is a circuit diagram showing the configuration of a sampling circuit according to a third embodiment.

Next, a sampling circuit 12 according to a third embodiment of the present invention will be described with reference to FIG. 7. FIG. 7 is a circuit diagram showing the configuration of a sampling circuit according to the third embodiment.

In FIG. 6, the case in which the input capacitances Cq of the first and second input transistors Q1 and Q2 of the sample-hold circuits SH are adjusted is described as an example. The present embodiment will describe a case in which input capacitances Cq of first and second semiconductor elements U1 and U2 provided separately from first and second input transistors Q1 and Q2 are adjusted.

In comparison with FIG. 1, first bias supply wiring Wb1 and second bias supply wiring Wb2 are added to the sampling circuit 11 according to the present embodiment as shown in FIG. 7. Further, in parallel with the first and second input transistors Q1 and Q2 of the respective sample-hold circuits SH, the first semiconductor elements U1 having an input terminal connected to a first transmission line W1 and the second semiconductor elements U2 having an input terminal connected to a second transmission line W2 are added between the connection points of the first and second input transistors Q1 and Q2 and a ground potential GND.

The first and second semiconductor elements U1 and U2 are composed of active elements having a p-n junction such as bipolar transistors, MOSFETs, and diodes. Therefore, like the first and second input transistors Q1 and Q2 described above, the first and second semiconductor elements U1 and U2 have first and second input capacitances Cu1 and Cu2 having dependence on bias voltages applied to both ends of a p-n junction, respectively. In the present embodiment, the bias voltages of an input signal din and a clock signal ck supplied to the first and second semiconductor elements U1 and U2, that is, first and second bias voltages Vb1 and Vb2 are adjusted to perform the variable control of the values of the input capacitances Cu1 and Cu2.

The first bias supply wiring Wb1 is wiring that supplies the first bias voltage Vb1 to the first semiconductor elements U1 in the respective sample-hold circuits SH. The second bias supply wiring Wb2 is wiring that supplies the second bias voltage Vb2 to the second semiconductor elements U2 in the respective sample-hold circuits SH. FIG. 7 shows a case in which both of the first bias supply wiring Wb1 and the second bias supply wiring Wb2 are provided but the case is not limited to this. Only any one of the first bias supply wiring Wb1 and the second bias supply wiring Wb2 may be provided.

The first bias voltage Vb1 is input from one end (input port) Pb1 of the first bias supply wiring Wb1 and supplied to the semiconductor elements U1 of the respective sample-hold circuits SH via the first bias supply wiring Wb1. Since the input capacitances Cu1 of the first semiconductor elements U1 reduce (increase) as the first bias voltage Vb1 becomes high (low), a first propagation time Tx1 in relation to the first transmission line W1 can be reduced (increased). Thus, the first propagation time Tx1 in relation to the first transmission line W1 can be controlled as a result of the adjustment of the voltage value of the first bias voltage Vb1.

Further, the second bias voltage Vb2 is input from one end (input port) Pb2 of the second bias supply wiring Wb2 and supplied to the second semiconductor elements U2 of the respective sample-hold circuits SH via the second bias supply wiring Wb2. Since the input capacitances Cu2 of the second semiconductor elements U2 reduce (increase) as the second bias voltage Vb2 becomes high (low), a second propagation time Tx2 in relation to the second transmission line W2 can be reduced (increased). Thus, the second propagation time Tx2 in relation to the second transmission line W2 can be controlled as a result of the adjustment of the voltage value of the second bias voltage Vb2.

Effect of Third Embodiment

As described above, the first propagation time Tx1 in relation to the first bias supply wiring Wb1 and the second propagation time Tx2 in relation to the second bias supply wiring Wb2 can be controlled according to the present embodiment. Generally, in order to change the sampling rate of time interleave, a time delay, that is, a sampling interval $\Delta T=Tck/n$ has also to be changed simultaneously when the clock frequency of a clock signal ck is changed. Since the first propagation time Tx1 and the second propagation time Tx2 can be controlled according to the present embodiment, the sampling interval $\Delta T$ can also be changed easily. Accordingly, the sampling circuit 12 that makes it possible to easily change the sampling rate of time interleave can be realized.

Further, since the first and second semiconductor elements U1 and U2 provided separately from the first and second input transistors Q1 and Q2 are used according to the present embodiment, the adjustment ranges of input capacitances in the respective sample-hold circuits SH can be easily increased. For example, the number of parallel connections of the first and second semiconductor elements U1 and U2 is only required to be increased. Accordingly, the control ranges of the first and second propagation times Tx1 and Tx2 can be widened. As a result, it becomes possible to more flexibly adjust the sampling rate of time interleave.

Extension of Embodiments

The present invention is described above with reference to the embodiments. However, the embodiments only show applied cases to help the understanding of the principle of the present invention, and the present invention is not limited to the embodiments. Various modifications that could be understood by persons skilled in the art within the scope of the present invention can be made to the configurations and details of the present invention. Further, the respective embodiments can be arbitrarily combined together to be performed to such an extent that no contradiction arises.

REFERENCE SIGNS LIST 10, 11, 12 Sampling circuit
SH Sample-hold circuit
SWSwitch
Cs Capacitive element
Q1 First input transistor
Q2 Second input transistor
U1 First semiconductor element
U2 Second semiconductor element
W Transmission line
W1 First transmission line
W2 Second transmission line
Wb1 First bias supply wiring
Wb2 Second bias supply wiring.

The invention claimed is:

1. A sampling circuit comprising:
a first transmission line configured to transmit an input signal;
a second transmission line configured to transmit a clock signal; and
a plurality of sample-hold circuits that are connected to the first and second transmission lines, the plurality of sample-hold circuits being spaced at a constant line distance, the plurality of sample-hold circuits being configured to sample the input signal supplied from the first transmission line at timing designated by the clock signal supplied from the second transmission line, and hold and output the sampled input signal, wherein
the first transmission line transmits the input signal at a first propagation time for each of the constant line distance,
the second transmission line transmits the clock signal at a second propagation time for each of the constant line distance, the second propagation time being different from the first propagation time, and the second propagation time being equal to a sum of a preset sampling interval and the first propagation time,
the plurality of sample-hold circuits include respective first input transistors having an input terminal connected to the first transmission line, and
the sampling circuit further comprises first bias supply wiring configured to supply a first bias voltage for adjusting input capacitances of the first input transistors to the first input transistors of the plurality of sample-hold circuits.

2. The sampling circuit according to claim 1, wherein the first transmission line or the second transmission line are composed of differential transmission lines.

3. The sampling circuit according to claim 1, wherein:
the plurality of sample-hold circuits include respective second input transistors having an input terminal connected to the second transmission line; and
the sampling circuit further comprises second bias supply wiring configured to supply a second bias voltage for adjusting input capacitances of the second input transistors to the second input transistors of the plurality of sample-hold circuits.

4. The sampling circuit according to claim 1, wherein:
impedance matching is performed between an output resistance of a signal source of the input signal connected to a first end of the first transmission line, characteristic impedance of the first transmission line, and a terminating resistance connected to a second end of the first transmission line inclusive of input capacitances of the plurality of sample-hold circuits, or
impedance matching is performed between an output resistance of a signal source of the clock signal connected to a first end of the second transmission line, characteristic impedance of the second transmission line, and a terminating resistance connected to a second end of the second transmission line inclusive of input capacitances of the plurality of sample-hold circuits.

5. The sampling circuit according to claim 1, wherein:
the first transmission line has a first line constant causing the input signal to propagate at the first propagation time; and
the second transmission line has a second line constant different from the first line constant and causing the clock signal to propagate at the second propagation time.

6. A sampling circuit comprising:
a first transmission line configured to transmit an input signal;
a second transmission line configured to transmit a clock signal; and
a plurality of sample-hold circuits that are connected to the first and second transmission lines, the plurality of sample-hold circuits being spaced at a constant line distance, the plurality of sample-hold circuits being configured to sample the input signal supplied from the first transmission line at timing designated by the clock signal supplied from the second transmission line, and hold and output the sampled input signal, wherein:
the first transmission line transmits the input signal at a first propagation time for each of the constant line distance,
the second transmission line transmits the clock signal at a second propagation time for each of the constant line distance, the second propagation time being different from the first propagation time, and the second propagation time being equal to a sum of a preset sampling interval and the first propagation time,
the plurality of sample-hold circuits include respective first semiconductor elements having an input terminal connected to the first transmission line in parallel with respective first input transistors connected to the first transmission line; and
the sampling circuit further comprises first bias supply wiring configured to supply a first bias voltage for adjusting input capacitances of the first semiconductor elements to the first semiconductor elements of the plurality of sample-hold circuits.

7. The sampling circuit according to claim 6, wherein:
the plurality of sample-hold circuits include respective second semiconductor elements having an input terminal connected to the second transmission line in parallel with respective second input transistors connected to the second transmission line; and
the sampling circuit further comprises second bias supply wiring configured to supply a second bias voltage for adjusting input capacitances of the second semiconductor elements to the second semiconductor elements of the plurality of sample-hold circuits.

8. A method comprising:
transmitting, by a first transmission line, an input signal;
a second transmission line configured to transmit a clock signal; and
sampling, by a plurality of sample-hold circuits, the input signal supplied from the first transmission line at timing designated by the clock signal supplied from the second transmission line, wherein the plurality of sample-hold circuits that are connected to the first and second transmission lines, the plurality of sample-hold circuits being spaced at a constant line distance; and
holding and outputting the sampled input signal, wherein
the first transmission line transmits the input signal at a first propagation time for each of the constant line distance,
the second transmission line transmits the clock signal at a second propagation time for each of the constant line distance, the second propagation time being different from the first propagation time, and the second propagation time being a sum of a preset sampling interval and the first propagation time,
the plurality of sample-hold circuits include respective first input transistors having an input terminal connected to the first transmission line, and
the method further comprises supplying, by first bias supply wiring, a first bias voltage for adjusting input capacitances of the first input transistors to the first input transistors of the plurality of sample-hold circuits.

9. The method according to claim 8, wherein the first transmission line or the second transmission line are composed of differential transmission lines.

10. The method according to claim 8, wherein:
the plurality of sample-hold circuits include respective second input transistors having an input terminal connected to the second transmission line; and
the method comprises supplying, by second bias supply wiring, a second bias voltage for adjusting input capacitances of the second input transistors to the second input transistors of the plurality of sample-hold circuits.

11. The method according to claim 8, wherein:
impedance matching is performed between an output resistance of a signal source of the input signal connected to a first end of the first transmission line, characteristic impedance of the first transmission line, and a terminating resistance connected to a second end of the first transmission line inclusive of input capacitances of the plurality of sample-hold circuits, or
impedance matching is performed between an output resistance of a signal source of the clock signal connected to a first end of the second transmission line, characteristic impedance of the second transmission line, and a terminating resistance connected to a second end of the second transmission line inclusive of input capacitances of the plurality of sample-hold circuits.

12. The method according to claim 8, wherein:
the first transmission line has a first line constant causing the input signal to propagate at the first propagation time; and
the second transmission line has a second line constant different from the first line constant and causing the clock signal to propagate at the second propagation time.

* * * * *